United States Patent
Choy et al.

(10) Patent No.: US 8,384,067 B2
(45) Date of Patent: Feb. 26, 2013

(54) HYBRID ORGANIC/NANOPARTICLE DEVICES

(75) Inventors: Wallace Chik Ho Choy, Shatin (HK); Tianhang Zheng, Hong Kong (HK)

(73) Assignee: The University of Hong Kong, Hong Kong (HK)

( * ) Notice: Subject to any disclaimer, the term of this patent is extended or adjusted under 35 U.S.C. 154(b) by 428 days.

(21) Appl. No.: 12/558,136

(22) Filed: Sep. 11, 2009

(65) Prior Publication Data

US 2010/0065814 A1    Mar. 18, 2010

Related U.S. Application Data

(60) Provisional application No. 61/097,405, filed on Sep. 16, 2008.

(51) Int. Cl.
*H01L 35/24* (2006.01)
(52) U.S. Cl. ........ 257/40; 257/13; 257/79; 257/E51.001
(58) Field of Classification Search ............... 257/13, 257/40, 79, E51.001
See application file for complete search history.

(56) References Cited

U.S. PATENT DOCUMENTS

| | | |
|---|---|---|
| 5,128,894 A | 7/1992 | Lin |
| 5,144,261 A | 9/1992 | Harvey et al. |
| 5,237,596 A | 8/1993 | Lin |
| 5,339,053 A | 8/1994 | Lux et al. |
| 5,543,748 A | 8/1996 | Ando |
| 5,815,008 A | 9/1998 | Williamson, III et al. |
| 5,869,845 A | 2/1999 | Vander Wagt et al. |
| 5,930,323 A | 7/1999 | Tang et al. |
| 6,252,430 B1 | 6/2001 | Vander Wagt et al. |
| 6,285,582 B1 | 9/2001 | Lin |
| 6,288,487 B1* | 9/2001 | Arai .............................. 313/506 |
| 6,303,941 B1 | 10/2001 | Xie et al. |
| 6,480,413 B2 | 11/2002 | Lin |
| 6,950,331 B2 | 9/2005 | Yang et al. |
| 7,202,708 B2 | 4/2007 | Luh et al. |
| 7,274,035 B2 | 9/2007 | Yang et al. |
| 7,482,621 B2 | 1/2009 | Yang et al. |
| 2007/0069199 A1* | 3/2007 | Choulis et al. ................. 257/40 |
| 2009/0009218 A1 | 1/2009 | Seo et al. |

OTHER PUBLICATIONS

Bhattacharyya et al., "Resonant Tunnelling and Fast Switching in Amorphous-Carbon Quantum-Well Structures", published online Dec. 25, 2005, 4 pages.
Chen et al., Single-Layer Organic Memory Devices Based on N, N'-di(naphthalene-1-yl)-N,N'-diphenyl-benzidine, Applied Physics Letters 87, 023505, published online Jul. 8, 2005, 3 pages.
Ling, Johnny, "Resonant Tunneling Diodes: Theory of Operation and Applications", University of Rochester, Rochester, NY 14627, no date given, 3 pages.
Ouyang et al., "Programmable Polymer Thin Film and Non-Volatile Memory Device", Nature Materials, vol. 3, Published online Nov. 28, 2004, 5 pages.
Park et al., "Multilevel Nonvolatile Small-Molecule Memory Cell Embedded with Ni Nanocrystals Surrounded by a NiO Tunneling Barrier", Nono Letters, vol. 9, No. 4, 1713-1319, Published Mar. 24, 2009, 7 pages.
Tseng et al., "Nanoparticle-Induced Negative Differential Resistance and Memory Effect in Polymer Bistable Light-Emitting Device", Appl. Phys. Lett., 88, 123506-8, published online Mar. 21, 2006, 3 pages.

(Continued)

*Primary Examiner* — Anthony Ho
(74) *Attorney, Agent, or Firm* — Berkeley Law & Technology Group, LLP

(57) ABSTRACT

Example embodiments disclosed herein may relate to organic electronic and/or organic optoelectronic devices, which may further relate to hybrid organic/nanoparticle devices with dual functions of resonant tunneling and light emission behaviors.

15 Claims, 9 Drawing Sheets

OTHER PUBLICATIONS

Vaidyanathan et al., "Influence of Surface Adsorption in Improving Ultrashallow Junction Formation", Applied Physics Letters 89, 152114, published online Oct. 11, 2006, 3 pages.

Wensorra et al., "Resonant Tunneling in Nanocolumns Improved by Quantum Collimation", Nano Letters, vol. 5, No. 12, 2470-2475, Revised Manuscript received Oct. 10, 2005, 6 pages.

* cited by examiner

RMS=2.207 nm
R$_{max}$=7.452 nm

RMS=0.358 nm
R$_{max}$=1.455 nm

HYBRID ORGANIC/NANOPARTICLE DEVICES

BACKGROUND

1. Field

The subject matter disclosed herein may relate to the field of organic electronic and/or organic optoelectronic devices, and in more particular may relate to hybrid organic/nanoparticle devices with dual functions of resonant tunneling and light emission behaviors.

2. Information

An organic layered device is a structure that sandwiches carbon-based films between two charged electrodes including a metallic cathode and a transparent anode, often formed on glass or silicon substrates. The films may include a hole-injection layer, a hole-transport layer (HTL), an emissive layer (EL) and an electron-transport layer (ETL). If external bias is applied to the device, injected positive (holes) and negative (electrons) charges may recombine in the emissive layer and may create electroluminescent light. This process is similar to typical organic light emitting devices (OLEDs), in which an exciton, which is a bound, excited electron and hole pair, may be generated inside an organic luminophore or organometallic luminophore emitting layer (EL). The exciton releases its energy radiatively, and a photon may be emitted. To create excitons, an emitting layer (EL) may be sandwiched between electrodes of differing work functions, and electrons may be injected into one side from a metal cathode to an EL via an ETL from a metal cathode, while holes may be injected in the other side from an anode to EL via a HTL. The electron and hole may meet in an EL layer to form an exciton.

Metallic nanoparticles may comprise structures in a nanometer dimension which exhibit particular electronic, optical, and chemical properties which may be attractive for applications ranging from electronic and optoelectronic devices. For resonance tunneling diodes (RTDs), these devices may have applications in organic memory cells, functional circuits and oscillator devices based on the folded voltage-current curve due to negative differential resistance (NDR). From the reported organic RTDs, the performance, such as in the aspect of peak-to-valley current ratio (PVCR) value and the line-width of current resonance peak, might be further improved upon.

BRIEF DESCRIPTION OF THE FIGURES

Claimed subject matter is particularly pointed out and distinctly claimed in the concluding portion of the specification. However, both as to organization and/or method of operation, together with objects, features, and/or advantages thereof, claimed subject matter may be better understood by reference to the following detailed description if read with the accompanying drawings.

Figure 1:
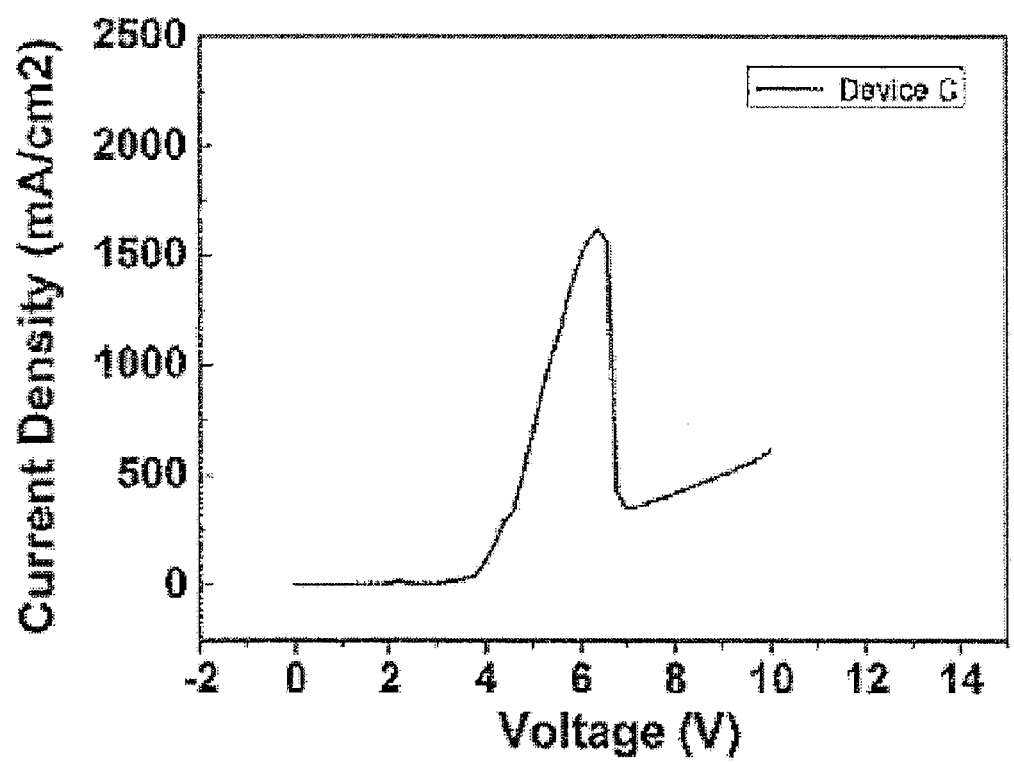
FIG. 1 is a graph illustrating a negative differential resistance result in accordance with one or more embodiments.

Reference is made in the following detailed description to the accompanying drawings, which form a part hereof, wherein like numerals may designate like parts throughout to indicate corresponding or analogous elements. For simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references such as, for example, up, down, top, bottom, over, above and so on, may be used to facilitate the discussion of the drawings and are not intended to restrict application of claimed subject matter. Therefore, the following detailed description is not to be taken in a limiting sense and the scope of claimed subject matter is intended to be defined by the appended claims and equivalents.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, methods, apparatuses or systems that would be known by one of ordinary skill have not been described in detail so as not to obscure claimed subject matter.

As discussed above, improved methods of fabricating OLEDs and methods of making luminescent materials that may be employed in OLEDs continue to be sought. At the same time, the exploration of improved OLED device architectures by combing other nanostructure systems may produce new device functions.

As will be discussed in greater detail below, the integration may be made between self-assembled silver nanoparticles (Ag NPs) and small-molecule semiconductor materials to form a hybrid organic/nanoparticle device. Such a hybrid organic/nanoparticle device may be included in an organic light emitting devices (OLEDs) structure. For example, an Ag NPs layer may be introduced on a substrate such as glass, fused silica and quartz coated with conductive transparent materials, such as an indium-tin-oxide (ITO) and fluorine doped tin oxide (FTO), followed by an organic layer. Such a hybrid organic/nanoparticle device may be constructed without adopting an Organic/NPs/Organic (ONO) structure.

As used herein, the term "metallic nanoparticles" may refer to the structures in nanoscale range which exhibit electronic, optical, and/or chemical properties that are attractive for applications ranging from electronic to optoelectronic devices, and/or the like. Properties of such metal nanoparticles may include inducing negative differential resistance (NDR) effect in situations where they are introduced into OLEDs structures between the transparent anode and HTL. NDR effect is a characteristic of resonant tunneling devices. Thus, organic resonant tunneling diodes (ORTDs) may be realized by combing metal nanoparticles and OLEDs architecture.

RTDs may have applications in organic memory cells, functional circuits and/or oscillator devices based at least in part on the folded voltage-current curve due to NDR. However, available organic RTDs may not have suitable performance, such as in the aspect of peak-to-valley current ratio (PVCR) value and/or in the aspect of the line-width of current resonance peak. Further, there may not be any available hybrid organic/nanoparticle architectures including a nanoparticle layer inserted into conventional OLED structures to achieve suitable performance of dual behaviors of light emission and resonant tunneling current.

In one embodiment, a hybrid organic/nanoparticle device may be constructed including small molecule organic semiconductors and silver (Ag) nanoparticles. Such a hybrid organic/nanoparticle device may exhibit unusual properties of an organic resonant tunneling diode (ORTD) at a reduced driving voltage region and may offer light emitting characteristics at an increased voltage. Such an hybrid organic/nanoparticle based ORTD may be utilized in bi-stable devices, switching devices, memory devices (such as SRAM and/or DRAM), analog oscillators, functional resonant tunneling diode (RTD)-based circuits (such as logic gate circuits), and/or as organic light emitting devices (OLEDs), such as for flat panel displays, to list but a few examples. For ORTD, such a hybrid organic/nanoparticle device may demonstrate a significant negative differential resistance (NDR) behavior at room temperature. Experimental results illustrate a current resonance with a peak-to-valley current ratio (PVCR) of over 4.6 and a narrow line-width of only approximately 1.4 V. Additionally, example operating mechanisms of charging and emission modes are described in more detail below, and such mechanisms may be discussed in terms of the charge-trapping effect of Ag nanoparticles. Mutual influences between charging and emission modes may suggest that a charging mode may be beneficial to a brightness and/or lifetime of emission mode, such as by potentially reducing operating voltage.

RTD may be realized using III-V compound material, such as Aluminum nitride, Gallium nitride, Indium gallium antimonide (InGaSb), or Indium gallium arsenide phosphide (InGaAsP) systems. However, such devices may not have entered mainstream applications yet because the processing of III-V materials may be incompatible with silicon complementary metal-oxide-semiconductor (CMOS) technology.

On the other hand, RTD may also be realized using a Si/SiGe materials system, for example. Further, RTD may also be realized using amorphous semiconductor devices with resonant tunneling properties, for an additional example. However, it is not clear that RTDs developed utilizing either amorphous semiconductor devices or a Si/SiGe materials system will have suitable properties for OLED and organic electronic applications.

Organic light emitting devices (OLEDs) have been studied for use in display and/or solid-state lighting applications. Meanwhile, other organic electronic and/or optoelectronic devices may be developed. Organic resonant tunneling diode (ORTD) is one type of such devices. ORTD may operate based at least in part on a negative differential resistance (NDR) characteristic. ORTD may be utilized in such applications as active static memory cells, analog oscillators and/or functional RTD-based circuits, to name but a few examples. NDR effects may be demonstrated in various organic devices. However, improved performance of ORTD may still be possible at room temperature, such as by enhancing PVCR value, developing reliable processing methods, and/or simplifying complicated device structures, for example.

Metal nanoparticles (NPs) may be utilized for inducing an NDR effect on organic memory devices. Such organic memory devices may employ an organic/NPs/organic (ONO) hybrid structure. NDR characteristic induced by metal NPs may be observed after an immediate increasing of current density. According to the feature of resultant current-voltage (I-V) curves, a resonance peak for such ONO hybrid structures may not have a symmetrical geometry to meet general requirements for ORTD usage, based at least in part on the resultant PVCR and/or spectral line-width values.

As will be described in greater detail below, a hybrid NPs/organic device may be based at least in part on the integration between self-assembled silver nanoparticles (Ag NPs) and small molecule semiconductor materials. For example, an OLED structure may be formed where an Ag NPs layer may be introduced on glass substrate with indium-tin-oxide (ITO) followed by an organic layer, without adopting an ONO structure. Such a hybrid device may exhibit characteristic features of ORTD at a decreased bias voltage while maintaining OLED characteristics at an increased voltage.

Referring to FIG. 1, a PVCR value of over 4.6 and narrow line-width of current resonance peak of approximately 1.4 V are illustrated. Mechanisms based on resonant current effect induced by Ag NPs are discussed in greater detail below.

Examples

A number of example embodiments are provide below, although it is not intended that claimed subject matter be limited to these particular example embodiments.

Figure 2:
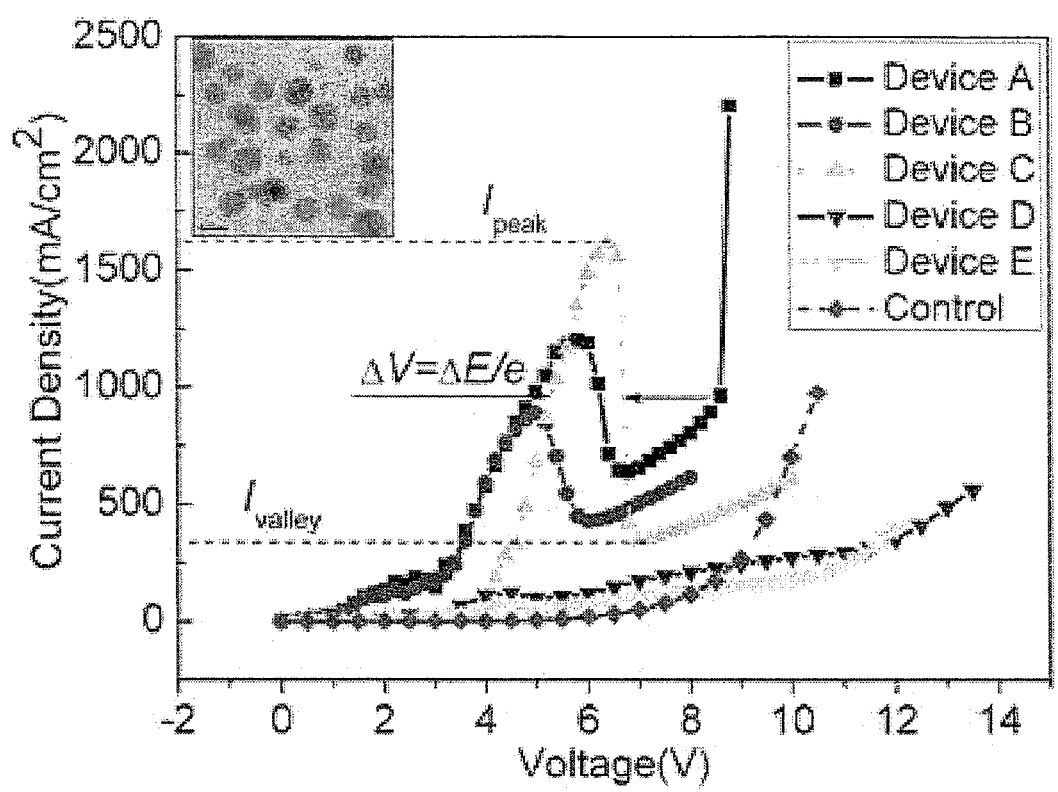
FIG. 2 is a graph illustrating current versus voltage in accordance with one or more embodiments, including an inset in of a transmission electron microscopy image of prepared Ag nanoparticles with a scale bar of 5 nm.

During experimentation, Ag NPs were synthesized using the method introduced by Sun et al. (Sun, S.; Zeng, H.; Robinson, D. B.; Raoux, S.; Rice, P. M.; Wang, S. X.; Li, G. J. *Am. Chem. Soc.* 2004, 126, 273-279.) In the synthesis, Ag acetate (1 mmol), oleic acid (3 mmol), oleylamine (3 mmol), phenyl ether (20 mL) and steary alcohol were mixed and magnetically stirred under a flow of nitrogen at the temperature of 80° C. The mixture was heated to 195° C. for 1 hour. The mixture was cooled to room temperature by removing the heat source. Under ambient conditions, ethanol (50 mL) was added into the solution, and finally Ag nanoparticles were precipitated and separated by centrifugation. In this process, Ag nanoparticle surfaces were capped by the organic ligand of Oleic acid which made them more stable. The resulting Ag NPs had a narrow size distribution, and the diameter was in the range of 4.5±0.5 nm confirmed by transmission electron microscopy, as shown in the inset of FIG. 2.

Various example devices were fabricated onto 120 nm indium-tin-oxide (ITO) coated glass substrates with a sheet resistance of 15 Ω/square. Prior to device fabrication, ITO substrates were cleaned using solvents and then exposed to UV-ozone treatment for 15 minutes. Afterwards, ITO substrates were transferred into a glove-box and a thin layer of Ag NPs was spin coated in various Ag concentrations of $5\times10^{-2}$, $2.5\times10^{-2}$, $1.25\times10^{-2}$, $6.25\times10^{-3}$, and $3.125\times10^{-3}$ mol/L, which correspond to Device A, Device B, Device C, Device D, and Device E, respectively. A 40 nm N,N'-diphenyl-N,N'-bis(1-naphthyl)-(1,1'-biphenyl)-4,4'-diamine (hereinafter NPB) and a 50 nm tris(8-hydroxyquinoline)aluminum (hereinafter $Alq_3$) were grown sequentially using a thermal evaporation method. A LiF(1 nm)/Al(100 nm) cathode was deposited and patterned using a shadow mask to define an active device area of 3.57 cm2. These five example devices were constructed to have a structure of ITO/Ag NPs/NPB(40 nm)/$Alq_3$(50 nm)/LiF(1 nm)/Al(100 nm). In addition, a control device of ITO/NPB(40 nm)/$Alq_3$(50 nm)/LiF(1 nm)/Al(100 nm) was fabricated as a reference.

The current density-voltage (I-V) and luminance-voltage (L-V) data of the prepared devices were measured with a Keithley 2400 and a calibrated Si photodiode. The electroluminescence (EL) spectra were recorded by an Oriel spectrometer with Cornerstone 260i. The capacitance-voltage (C-V) measurements were carried out using HP4284A precision LCR meter at 106 Hz. The atomic force microscopy (AFM) morphology of thin film was characterized by a Digital Instruments NanoScope III with tapping mode. All measurements were carried out at room temperature under ambient atmosphere.

Results

FIG. 2 illustrates current versus voltage (I-V) curves of example hybrid organic/NPs devices A-E along with the control OLED. By introducing Ag NPs between ITO and NPR, features of the I-V curves vary from that of the control OLED. At a reduced driving voltage (<8 V), all five hybrid devices A-E display a larger current density as compared that of the control OLED, especially for the devices with increased concentration of Ag NPs. Moreover, the current rises steadily with the increase of applied voltage as compared to abrupt increases in some ONO-type devices. Ag NPs devices A-C show peak and valley currents ($I_{peak}$ and $I_{valley}$) appearing between 4 and 7 V, which is a typical I-V characteristics of ORTD. Such $I_{peak}$, $I_{valley}$ and PVCR may depend on the concentration of Ag NPs, as summarized in Table 1 below.

TABLE 1

Dependence of resonant tunneling properties on the concentration of Ag NPs in hybrid organic/nanoparticle devices.

| Device | $I_{peak}$ (mA/cm²) | $I_{valley}$ (mA/cm²) | PVCR | ΔV (V) | Ag (mol/L)$^a$ |
|---|---|---|---|---|---|
| Device A | 1202.3 | 641.1 | 1.9 | 1.5 | $5\times10^{-2}$ |
| Device B | 889.6 | 429.8 | 2.1 | 1.4 | $2.5\times10^{-2}$ |
| Device C | 1615.7 | 351.2 | 4.6 | 1.4 | $1.25\times10^{-2}$ |
| Device D | 123.3 | 100.2 | 1.2 | 1.1 | $6.25\times10^{-3}$ |
| Device E | 74.6 | 66.1 | 1.1 | 0.8 | $3.125\times10^{"3}$ |

In Table 1, above, Ag (mol/L) is the Ag NPs concentration in the ethanol solution before pin-coating process, and the processing conditions of Ag NPs are similar for all devices A-E.

Among these parameters, PVCR may comprise an indication of merit for ORTD. The highest PVCR of 4.6 and the near symmetrical current resonance with a narrow line-width of approximately 1.4 V (defined as full width of voltage (ΔV) at half maximum of resonant current peak) were illustrated in device C. A maximum oscillation frequency of this ORTD may be estimated from its I-V characteristics in NDC region by equation (1), below.

$$f_{max} = C^{-1} \times \frac{\Delta I}{\Delta V} \quad (1)$$

Here, C is geometric capacitance at the voltage where the maximum negative conductance is obtained. ΔI and ΔV is the change of current and voltage, respectively. C is about 700 pF at the maximum negative conductance from microwave measurement. Hence, the $f_{max}$ of 0.064 GHz can be realized at room temperature.

Figure 3:
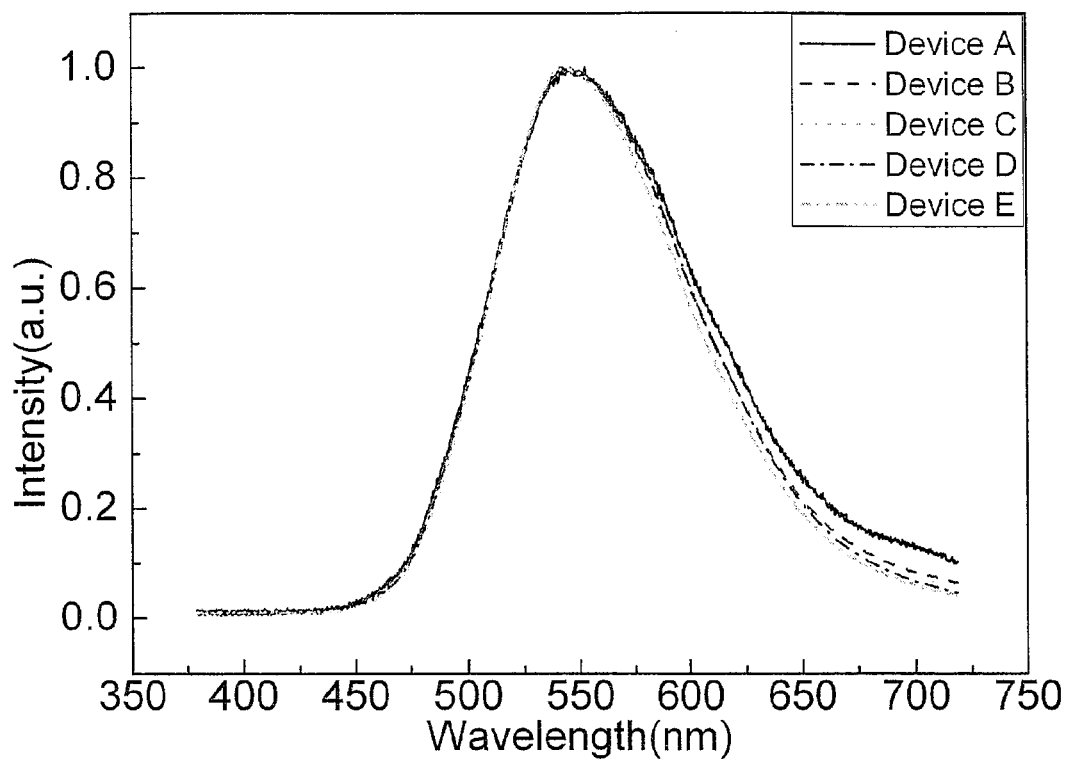
FIG. 3 is a graph illustrating electroluminescence spectra of hybrid organic/nanoparticle devices in accordance with one or more embodiments.

Referring to FIG. 3, on the other hand, if the applied voltage is higher than the critical value at $I_{valley}$, example hybrid devices A-E exhibited the characteristics of an OLED emitting green light from $Alq_3$, and the electroluminescence (EL) spectra of the Ag NPs device are generally similar to that of the control device. Additionally or alternatively, other colors such as red and/or blue, may be emitted based at least in part on doping of other guest materials into a given device. Some variance between example devices A-E may result from thickness fluctuation of Ag NPs layers. For example, in situations where the concentration of Ag NPs becomes dilute, in the same spin-coating conditions, the thickness of Ag NPs may be reduced correspondingly.

Dual behaviors including resonant tunneling and/or light emission may be explained by different operating mechanisms over a driving voltage region. Metallic NPs may be electrochemically charged by applying an external bias to filling electronic states, and carriers may be stable in their charged state, such as for those with thin capping ligand passivation, for example. Therefore, Ag NPs may become many discrete deep charge-trapping centers to store charges. At certain potentials, such charges may tunnel into metal cores or out of such cores through the capping layer, potentially inducing resonant tunneling current.

Figure 4A:
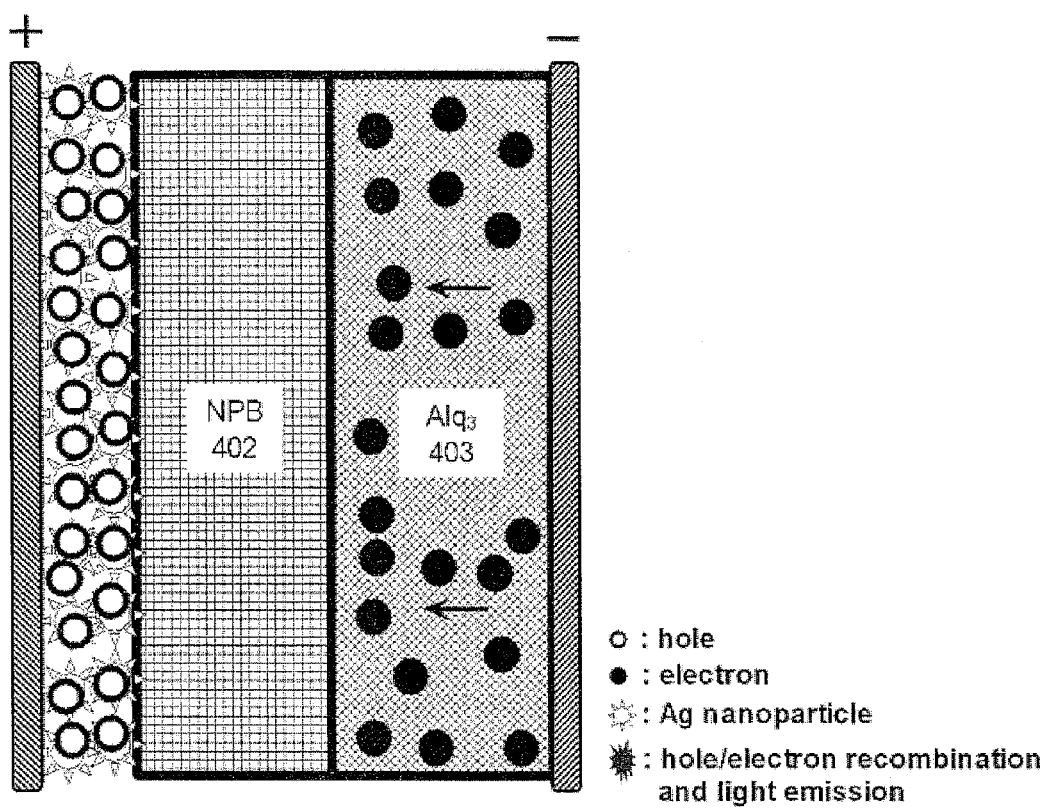
FIG. 4a is a cross section schematic diagram illustrating a charging mode operating mechanism in a hybrid organic/nanoparticle device in accordance with one or more embodiments.
Figure 4B:
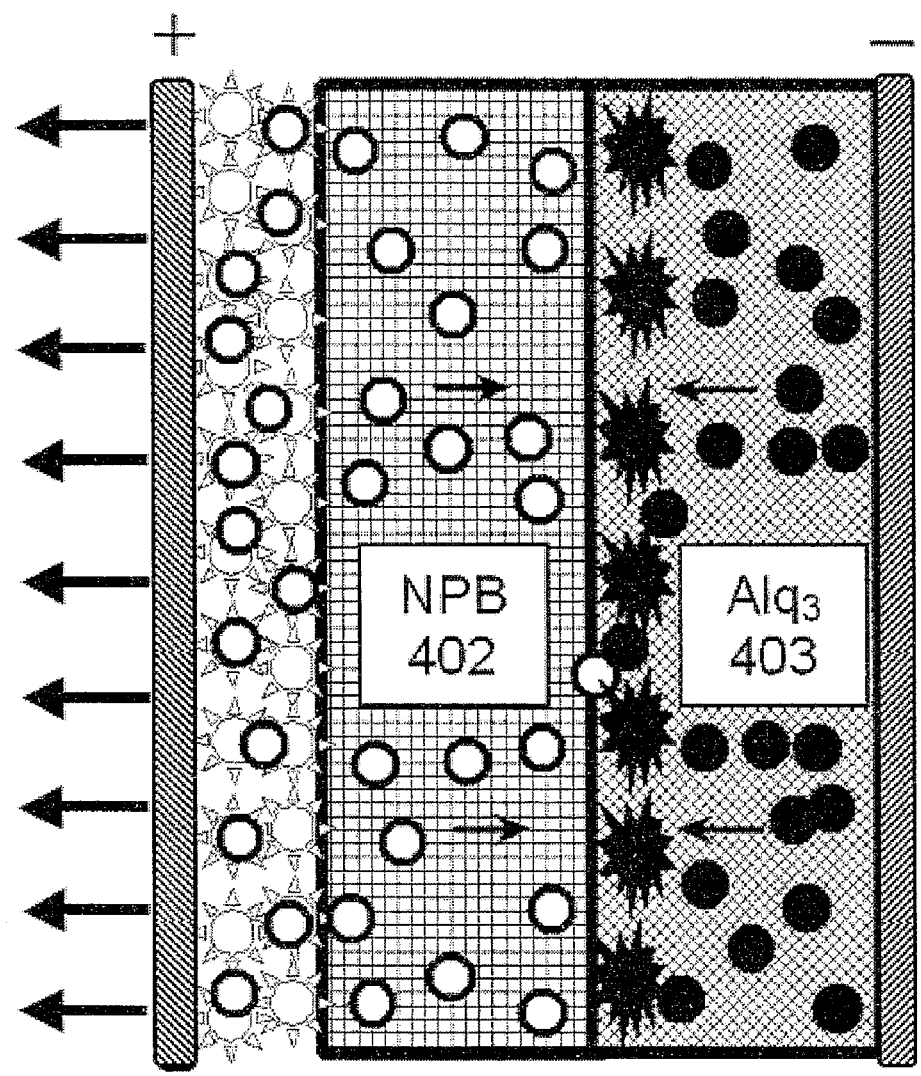
FIG. 4b is a cross section schematic diagram illustrating an emission mode operating mechanism in a hybrid organic/nanoparticle device in accordance with one or more embodiments.
Figure 4C:
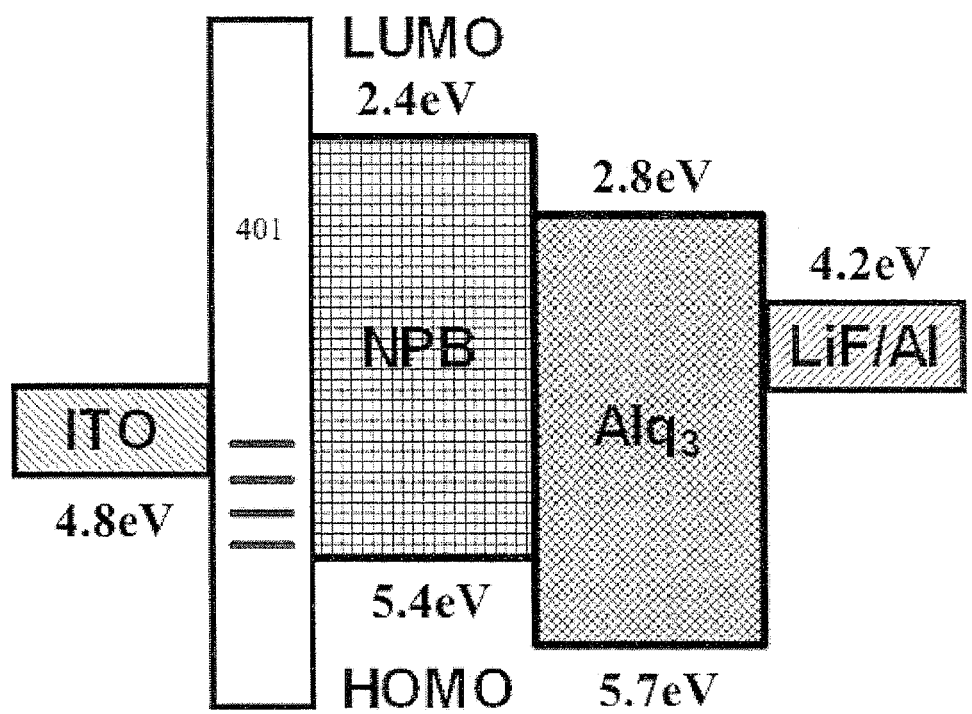
FIG. 4c is a schematic diagram illustrating an energy level alignment in a hybrid organic/nanoparticle device in accordance with one or more embodiments.

FIG. 4c illustrates a corresponding schematic diagram of such example hybrid organic/NPs devices, where energy levels give the value of highest occupied molecule orbital (HOMO) level and the lowest unoccupied molecule orbital (LUMO) level for the various materials. The short lines in the capping organic ligand 401 represent the trapping level of Ag NPs.

FIGS. 4a and 4b illustrate a model depicting potential operating mechanisms of such organic/NPs hybrid devices. Dual behaviors may be described by two different operating stages shown with the charging mode of FIG. 4a at a reduced voltage range and the emission mode of FIG. 4b at an increased voltage range. For a charging mode, such hybrid organic/NPs devices may function much like a capacitor, where holes and electrons may be injected from anodes and cathodes, respectively. With the voltage increasing from zero to the value at $I_{peak}$, the electric-field induced hole charges may transfer from a capping layer into Ag NPs and may charge up the Ag NPs continuously. At the same time, electrons may accumulate in an $Alq_3$ layer and may not pass through this layer due to the effective electron blocking effect of an NPB layer in an NPB/$Alq_3$ interface. Subsequently, a larger charging current may be obtained as compared with the I-V characteristics of the control OLED. Moreover, an increased charging energy may be stored in such Ag NP devices based at least in part on a trapping effect of small size Ag NPs. The Coulomb energy ($E_c$) to charge a spherical nanoparticle with a uniform capping layer may be estimated by the following equations.

$$E_c = \frac{e^2}{2C} \quad (2)$$

$$C = 4\pi\varepsilon_0\varepsilon_r R \quad (3)$$

Here, C represents the capacitance of an Ag nanoparticle, $\epsilon_o$ represents the permittivity of free space, $\epsilon_r$ represents the permittivity of a capping material, and R represents the radius of an Ag nanoparticle. For 4.5 nm Ag NPs, the $E_c$ may be as high as 0.05 eV. Therefore, when the electric field increases to the point where the Fermi level of the Ag NPs approaches to the HOMO of NPB, the current reaches to $I_{peak}$. As the applied voltage continues to increase, more and more holes may gain enough energy to tunnel through a thin capping layer, and thus the current may be decreased quickly. At such a moment, such example hybrid organic/NPs devices may switch from the operating mode illustrated at FIG. 4a to the emission mode illustrated at FIG. 4b. In such an emission mode, charges may begin to transport into an NPB layer 402 and towards the $Alq_3$ layer 403. Accumulated electrons in the LUMO of $Alq_3$ may recombine with holes at an interface between NPB and $Alq_3$ to emit light.

There may be no light emission for such hybrid organic/NPs devices in a charging mode. This may indicate that one type of charge carriers may be absent in a recombination region. Such an absent charge carrier may be holes, based at least in part on the mechanisms described above. In order to confirm this analysis, Ag NPs was dispersed into a solution of poly(ethylenedioxythiphene):polysty-renesulphonic acid (PEDOT:PSS) (Baytron Al4083), which has appropriate hole injection properties. The concentration of Ag NPs was set to $1.25 \times 10^{-2}$ mol/L that is similar to the concentration used in device C. Three devices were fabricated with the structure of ITO/PEDOT:PSS:Ag NPs/NPB/$Alq_3$/LiF/Al, ITO/PEDOT:PSS:Ag NPs/$Alq_3$/LiF/Al, and ITO/PEDOT:PSS:Ag NPs/NPB/LiF/Al.

Figure 5:
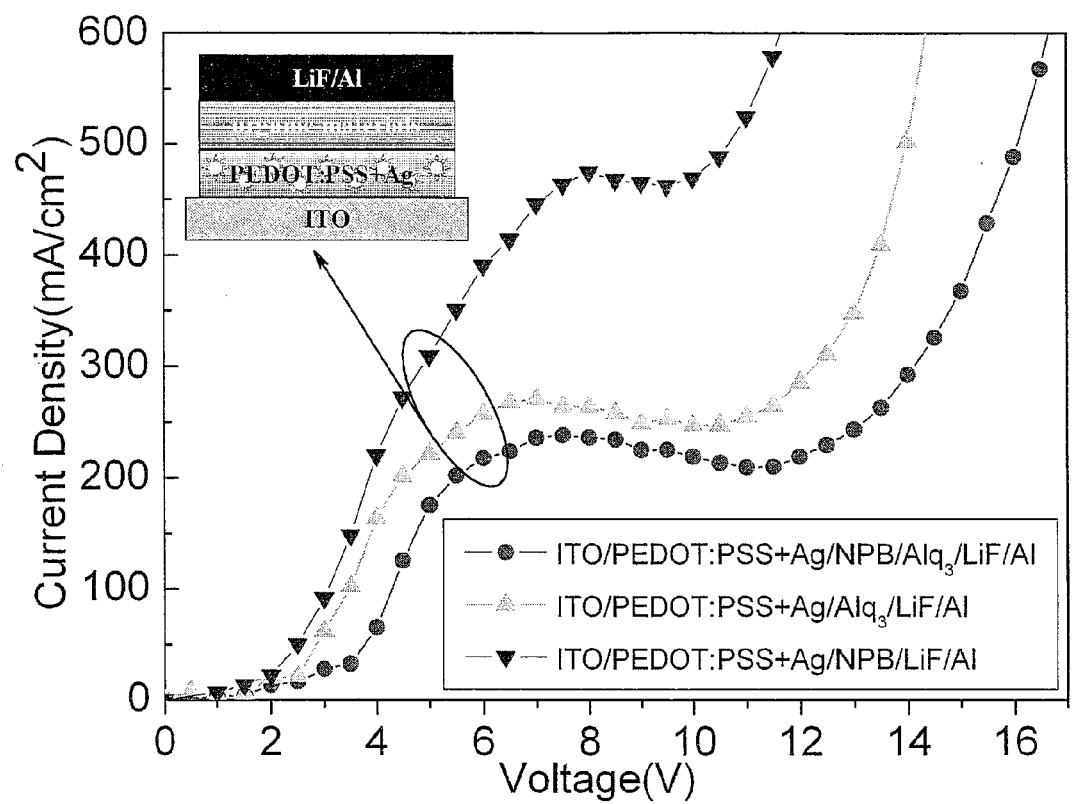
FIG. 5 is a graph illustrating current versus voltage characteristics for various devices in accordance with one or more embodiments.

Referring to FIG. 5, various I-V characteristics of three example devices are illustrated. Firstly, for two devices with NPB or $Alq_3$ only, the I-V curves exhibit broad and weak resonant current peaks, which may verify that carriers may be trapped by Ag NPs. However, there are several different performances for the devices with PEDOT:PSS:Ag NPs as compared with that of device C. One such distinction may be weak current resonant peaks with their PVCR around 1.0-1.2. Another such distinction may be the broad line-width of about 2-5 V. A further distinction may be that the current density is generally smaller at any applied voltage, as shown in FIG. 1. The reason for these three different performances may lie in the introduction of PEDOT:PSS into the hybrid devices. It may be that the operating mechanism has changed in this region. In such a case, holes may not only reside in the trapping centers, but also may transport into the NPB layer at the same time through newly forming transport channels of PEDOT:PSS. Therefore, the two modes including charging and emission may likely coexist here although its luminance is still reduced in this region, which is different from device C where holes may be mainly trapped in Ag NPs layer in the charging process.

Figure 6A:
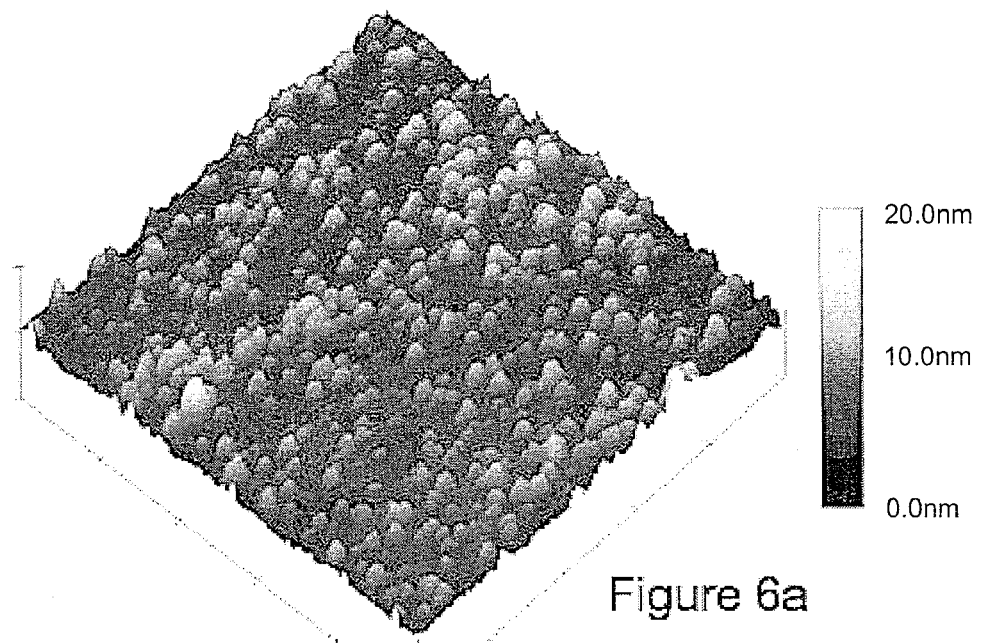
FIG. 6a is a graph illustrating three dimensional atomic force microscopy surface images of a silver nanoparticles (Ag NPs) film without PEDOT:PSS.
Figure 6B:
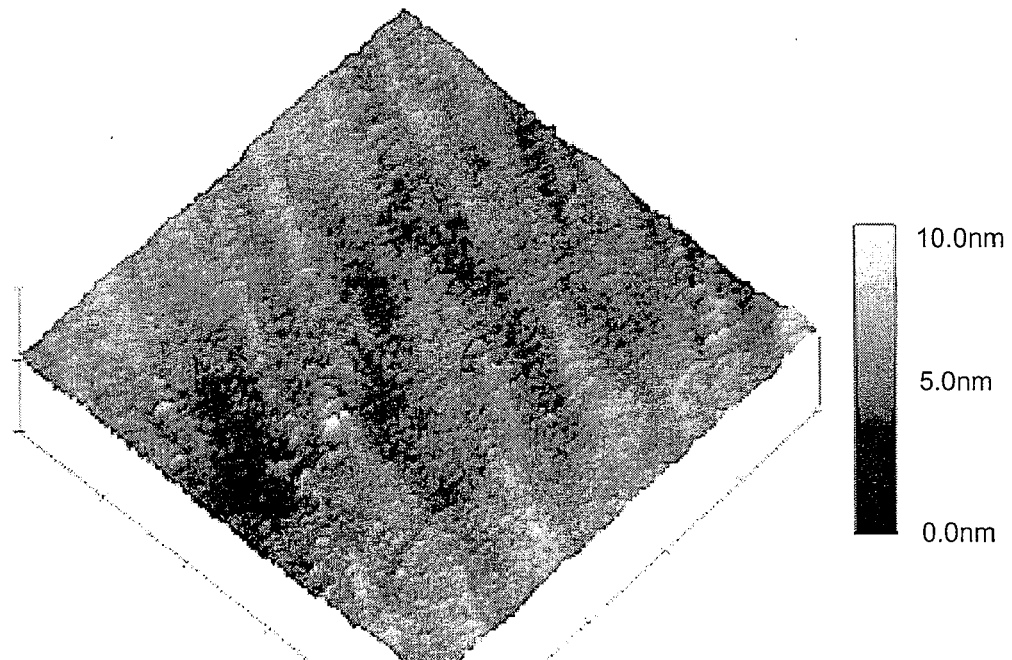
FIG. 6b is a graph illustrating three dimensional atomic force microscopy surface images of a Ag NPs film with PEDOT:PSS.

Referring to FIGS. 6a and 6b, a surface morphology of Ag NPs and PEDOT:PSS:Ag NPs thin film before the growth of organic materials measured by atomic force microscope (AFM) is illustrated. A formation of new carrier transport channels may be further distinguished by the variation of thin film morphology. Both samples were stored in vacuum box for about 2 days before AFM measurement so that possible phase separation may be identified. In Ag NPs thin film, illustrated by FIG. 6a, a series of nearly identical ripples may be observed over the whole area due to the pile of Ag NPs, which has a room-mean-square (RMS) roughness about 2.207 nm and a maximum roughness about 7.452 nm, respectively. However, in PEDOT:PSS:Ag NPs thin film, illustrated by FIG. 6b, a higher surface quality with near-uniform morphology may be observed with no obvious height fluctuation, and its RMS and maximum roughness is about 0.358 and 1.455 nm, respectively. No evidence of phase separation was observed, implying that Ag NPs may be well-dispersed in PEDOT:PSS solution. Likewise, no noticeable ripples induced from Ag NPs were observed. Therefore, in some positions, there may be no Ag NPs in PEDOT:PSS thin film, which may provide the carrier transport channels for hole from PEDOT:PSS to NPB directly. This may be a reason for a weak and broad resonant current peak.

In summary, an example embodiment of a hybrid organic/NPs device with resonant tunneling and light emitting behaviors may be assembled consistent with the procedures discussed above. A PVCR value more than 4.6 and narrow line-width of current resonance peak of approximately 1.4 V with a nearly symmetrical resonance peak may be obtained, for an example embodiment. Additionally, such a hybrid organic/NPs device may demonstrate such behavior at room temperature. Operating mechanisms including charging and emission modes may explain the properties of such hybrid organic/NPs devices. Resonant tunneling behavior may result from a strong trapping effect of small size Ag NPs, which may influence the performance an emission mode based at least in part on a charging effect. Such an effect may be beneficial to the brightness and lifetime of OLEDs utilizing such a hybrid organic/NPs device, potentially by reducing operating voltage. By combing the properties of NPs and organic materials, such a hybrid organic/NPs device may be utilized for ORTD and/or its utilization with OLEDs. For example, such a hybrid organic/NPs device may be generally applicable for ORTD-based electronic and electro-optical devices.

An embodiment of a hybrid NPs/organic device may include a layered structure of self-assembled metal nanoparticles located between a substrate coated with an electrode and an organic material, where a cathode may be associated with such an organic material. Such a substrate may be for example a glass substrate or silicon. The substrate may be coated with a good electrical conducting material such as an indium-tin-oxide (ITO) coated glass substrates, and/or the like. Additionally, such a substrate with a good electrical conducting material, such as ITO, may act as a transparent anode, such as in instances where a hybrid NPs/organic device is utilized in an OLED.

Such self-assembled metal nanoparticles may include self-assembled silver nanoparticles (Ag NPs). Such metal nanoparticles may have their surfaces capped with an organic ligand to provide suitable stability. Such capping ligands may include Oleic acid, and/or other organic ligands suitable for providing suitable stability to such NPs. Likewise, such self-assembled metal nanoparticles may include other self-assembled nanoparticles such as, for example, self-assembled gold nanoparticles, self-assembled platinum nanoparticles, self-assembled aluminum nanoparticles, self-assembled titanium oxide nanoparticles, other noble metal nanoparticles, and/or the like, and/or combinations thereof. For example, such self-assembled metal nanoparticles may include compounds that exhibit similar behavior to that of Ag NPs, such as similar behaviors with respect to weak negative differential resistance. Such non-silver self-assembled metal nanoparticles may be selected based at least in part on the behavior of NDR or RTC. For example, metallic nanoparticles may be electrochemically charged by applying an external bias to fill electronic states, and carriers may be stable in a charged state, including those metallic nanoparticles with a passivation of a capping ligand. In cases where the voltage increases to certain value, a trapping level of Ag NPs may be aligned with the HOMO of NPB, and the resonant channel may be been formed and the current reaches to the value of $I_{peak}$. Above this voltage, the energy of resonant state may fall into the trapping state of Ag NPs that will raise the interfacial barrier to make the current decrease, and thus NDR occurs at the moment. Similar behavior may be expected for non-silver self-assembled metal nanoparticles, as described above. However, where non-silver metals are utilized, variations in the low conductive capping ligands (such as Oleic acid) and/or device structure may be considered.

An organic material may be located between self-assembled metal nanoparticles and a cathode. Such an organic material may include one or more layers of one or more organic semiconductor materials (such as small molecules or polymers). For example, such an organic material may include one or more layers of N,N'-diphenyl-N,N'-bis(1-naphthyl)-(1,1'-biphenyl)-4,4'-diamine (hereinafter NPB), tris(8-hydroxyquinoline)aluminum (hereinafter $Alq_3$), and/or the like, and/or combinations thereof. A cathode may be associated with such an organic material. Such a cathode may include a lithium fluoride (LiF)/aluminum (Al) compound, magnesium-silver alloy, calcium (Ca)/Al, caesium fluoride (CsF)/Al and/or the like.

Such a hybrid organic/nanoparticle device may demonstrate a significant negative differential resistance (NDR) behavior at room temperature where the peak-to-valley ratio (PVCR) may be more than 2. Experimental results illustrate a current resonance with PVCR of over 4.6 and a narrow linewidth of only approximately 1.4 V. For example, ranges of PVCR of about 2.0 to about 4.6, about 3.0 to about 4.6, and/or at least about 4.6 at room temperature may be obtainable from such hybrid organic/nanoparticle devices. PVCR values of more than 2-3 may be suitable for potential RTD applications. In addition, a relatively sharp I-V curve in the NDR region, such as illustrated by device C in FIG. 2, may be suitable for potential RTD applications. Further, relatively narrow linewidth may provide energy savings as compared to relatively broader line-widths. Still further, in situations where such a hybrid organic/nanoparticle device is utilized as an OLED, luminance may meet a range of more than 100 $cd/cm^2$ to meet display or other applications, such as a range of about 100 $cd/cm^2$ to about 200 $cd/cm^2$, for example. Such a hybrid organic/nanoparticle based OLED may have a cost that may be comparable to existing OLEDs.

In applications where such a hybrid organic/nanoparticle device is being utilized as a light-emitting device, such as an OLED, self-assembled metal nanoparticles may be introduced between the electrode coated substrate and organic semiconductor layers. Such a substrate may include an indium-tin-oxide coated glass substrate, for example. Such a self-assembled metal nanoparticles may include self-assembled silver nanoparticles, which may be coated with an organic ligand, for example. Additionally or alternatively, such self-assembled metal nanoparticles may include self-assembled silver nanoparticles, self-assembled gold nanoparticles, self-assembled platinum nanoparticles, self-assembled aluminum nanoparticles, self-assembled titanium oxide nanoparticles, and/or the like, and/or combinations thereof. An emissive layer may be located between an electron transporting layer comprising an electron transporting organic semiconductor and a hole transporting layer comprising a hole transporting organic semiconductor. Such an emissive layer may include an emissive organic compound, such as N,N'-diphenyl-N,N'-bis(1-naphthyl)-(1,1'-biphenyl)-4,4'-diamine, for example. Such an electron transporting layer may include an electron transporting organic, such as tris(8-hydroxyquinoline)aluminum, for example. A cathode may be associated over such an electron transporting layer, sandwiching the hole transporting layer, emissive layer, and electron transporting layer between the substrate and the cathode.

In applications where such a hybrid organic/nanoparticle device is being utilized as an RTD device, there may be several applications including, but not limited to, memory cells and/or functional RTD-based circuits. In such RTD type hybrid organic/nanoparticle devices, such a device may exhibit several different states in current-voltage characteristics, which may be used for different processes. For example, such different states in current-voltage characteristics may be used during operation of memory cells. Additionally, such RTD type hybrid organic/nanoparticle devices may be utilized in oscillator circuits. In such oscillator circuits, a negative differential resistance may be used to compensate for unavoidable ohmic losses in the circuits.

Further, such RTD type hybrid organic/nanoparticle devices may be utilized in power supply circuits. In such power supply circuits, resistance and RTD may have several different states which may correspond to different operating points. Such different states corresponding to different operating points may be used for logic devices, such as switch circuits, and/or the like. Of course, these are merely example applications for embodiments of hybrid organic/nanoparticle devices in accordance with claimed subject matter, and the scope of claimed subject matter is not limited in this respect.

Figure 7:
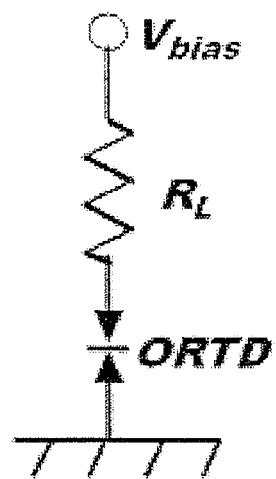
FIG. 7 is a schematic diagram illustrating a switch circuit based at least in part on an RTD device in accordance with one or more embodiments.
Figure 8:
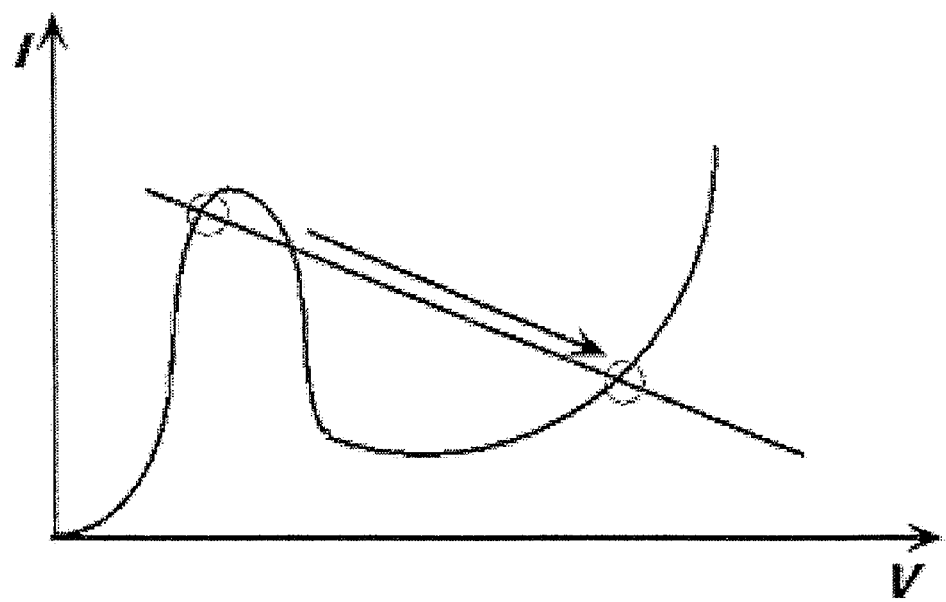
FIG. 8 is a graph illustrating current versus voltage of the device of FIG. 7, in accordance with one or more embodiments is illustrated.

Referring to FIG. 7, a switch circuit based at least in part on an example embodiment of a RTD type hybrid organic/nanoparticle device is illustrated. Further, FIG. 8 is a graph illustrating current versus voltage characteristics of the device illustrated in FIG. 7. Such a switch circuit may switch its state in situations where voltage increases to a value that makes the switch circuit switch from an "off" level to "on" level, for example.

The terms, "and," "and/or," and "or" as used herein may include a variety of meanings that will depend at least in part upon the context in which it is used. Typically, "and/or" as well as "or" if used to associate a list, such as A, B or C, is intended to mean A, B, and C, here used in the inclusive sense, as well as A, B or C, here used in the exclusive sense. Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of the appended claims, and equivalents thereof.

The invention claimed is:

1. A light-emitting device comprising:
   a substrate;
   an anode;
   a layer of self-assembled metal nanoparticles;
   a hole transporting layer comprising a hole transporting organic compound;
   an emissive layer comprising an emissive organic compound;
   an electron transporting layer comprising a electron transporting organic compound, the electron transporting layer separate from the layer of self-assembled metal nanoparticles; and
   a cathode formed on said electron transporting layer, said cathode and said anode to sandwich said hole transporting layer, said emissive layer, and said electron transporting layer.

2. The light-emitting device of claim 1, wherein said substrate comprises one or more of an indium-tin-oxide coated glass substrate, an indium-tin-oxide coated silicon substrate, an indium-tin-oxide coated quartz substrate, a zinc-tin-oxide coated glass substrate, a Poly-(3,4-ethylenedioxythiophene) doped with poly (styrenesulfonate) (PEDOT:PSS) coated glass substrate, a silicon substrate, and a quartz substrate.

3. The light-emitting device of claim 1, wherein said self-assembled metal nanoparticles comprise self-assembled silver nanoparticles, wherein said self-assembled silver nanoparticles are coated with an organic ligand.

4. The light-emitting device of claim 1, wherein said emissive organic compound comprises one or more of N,N'-diphenyl-N,N'-bis(1-naphthyl)-(1,1'-biphenyl)-4,4'-diamine, or N,N'-Bis(3-methylphenyl)-N,N'-bis(phenyl)-benzidine (TPD), 4,4-N,N'-Dicarbazole-1,1'-biphenyl (CBP), Tris(4-carbazoyl-9-ylphenyl)amine (TCTA), 1,3-Bis(carbazol-9-yl)benzene (mCP), 4,4'-Bis(9-carbazolyl)-2,2'-dimethylbiphenyl (CDBP), tris(8-hydroxyquinoline)aluminum, 4,7-diphenyl-1,10-phenanthroline (BPhen), and Bis(2-methyl-8-quinolinolate)-4-(phenylphenolato)aluminium (BAlq), and/or other organic materials that can transport hole carriers effectively.

5. The light-emitting device of claim 1, wherein said electron transporting organic compound comprises one or more of tris(8-hydroxyquinoline)aluminum, 2,2',2"-(1,3,5-Benzinetriyl)-tris(1-phenyl-1-H-benzimidazole) (TPBi), 2,9-Dimethyl-4,7-diphenyl-1,10-phenanthroline (BCP), 4,7-Diphenyl-1,10-phenanthroline (BPhen), and Bis(2-methyl-8-quinolinolate)-4-(phenylphenolato)aluminium (BAlq), and/or other organic materials that can transport electrons effectively.

6. The light-emitting device of claim 1, wherein a peak-to-valley current ratio for said light-emitting device comprises one or more approximate ranges of from about 2.0 to about 4.6 and at least about 4.6 at room temperature.

7. The light-emitting device of claim 1, wherein said light-emitting device comprises a luminance of more than 100 cd/cm$^2$.

8. The light-emitting device of claim 1, wherein said light-emitting device comprises a luminance from about 100 cd/cm$^2$ to about 10,000 cd/cm$^2$.

9. A resonant tunneling diode comprising:
   a substrate;
   an anode;
   a self-assembled metal nanoparticle layer;
   a hole transporting layer comprising a hole transporting organic material;
   an electron transporting layer comprising an electron transporting organic material; and
   a cathode formed on said electron transporting organic material, said cathode and said anode to sandwich the self-assembled metal nanoparticle layer, the hole transporting organic material, and the electron transporting organic material.

10. The resonant tunneling diode of claim 9, wherein said substrate comprises one or more of an indium-tin-oxide coated glass substrate, an indium-tin-oxide coated silicon substrate, an indium-tin-oxide coated quartz substrate, a zinc-tin-oxide coated glass substrate, a Poly-(3,4-ethylenedioxythiophene) doped with poly (styrenesulfonate) (PEDOT:PSS) coated glass substrate, a zinc-tin-oxide coated silicon substrate, a Poly-(3,4-ethylenedioxythiophene) doped with poly (styrenesulfonate) (PEDOT:PSS) coated silicon substrate, a zinc-tin-oxide coated quartz substrate, and a Poly-(3, 4-ethylenedioxythiophene) doped with poly (styrenesulfonate) (PEDOT:PSS) coated quartz substrate.

11. The resonant tunneling diode of claim 9, wherein said self-assembled metal nanoparticle layer comprises self-assembled silver nanoparticles, wherein said self-assembled silver nanoparticles are coated with an organic ligand.

12. The resonant tunneling diode of claim 9, wherein said hole transporting organic material comprises one or more of N,N'-diphenyl-N,N'-bis(1-naphthyl)-(1,1'-biphenyl)-4,4'-diamine, or N,N'-Bis(3-methylphenyl)-N,N'-bis(phenyl)-benzidine (TPD), 4,4-N,N'-Dicarbazole-1,1'-biphenyl (CBP), Tris(4-carbazoyl-9-ylphenyl)amine (TCTA), 1,3-Bis(carbazol-9-yl)benzene (mCP), 4,4'-Bis(9-carbazolyl)-2,2'-dimethylbiphenyl (CDBP), or other organic materials that can transport hole carriers effectively located adjacent said self-assembled metal nanoparticle layer, and wherein said electron transporting organic material comprises one or more of tris(8-hydroxyquinoline) aluminum, or 2,2',2"-(1,3,5-Benzinetriyl)-tris(1-phenyl-1-H-benzimidazole) (TPBi), 2,9-Dimethyl-4,7-diphenyl-1,10-phenanthroline (BCP), 4,7-Diphenyl-1,10-phenanthroline (BPhen), Bis(2-methyl-8-quinolinolate)-4-(phenylphenolato)aluminium (BAlq) or other organic materials that can transport electrons effectively, located adjacent said cathode.

13. The resonant tunneling diode of claim 9, wherein said resonant tunneling diode has a peak-to-valley current ratio comprising one or more approximate ranges of from about 2.0 to about 4.6 and at least about 4.6 at room temperature.

14. The resonant tunneling diode of claim 9, wherein said resonant tunneling diode comprises a luminance of more than 100 cd/cm$^2$.

15. The resonant tunneling diode of claim 9, wherein said resonant tunneling diode comprises a luminance from about 100 cd/cm$^2$ to about 200 cd/cm$^2$.

* * * * *